United States Patent [19]

Goo et al.

[11] Patent Number: 4,939,407
[45] Date of Patent: Jul. 3, 1990

[54] BLOCK PATTERNING OF THE METALLIZATION OF POLYVINYLIDENE FLUORIDE TRANSDUCERS

[75] Inventors: Gee-In Goo, Silver Spring; Thomas A. Waters, Columbia, both of Md.

[73] Assignee: The United States of America as represented by the Secretary of the Navy, Washington, D.C.

[21] Appl. No.: 215,136

[22] Filed: Jul. 5, 1988

[51] Int. Cl.⁵ .......................................... H01L 41/08
[52] U.S. Cl. ...................................... 310/366; 310/800
[58] Field of Search ............... 310/800, 366, 334, 341, 310/311, 328; 428/422

[56] References Cited

U.S. PATENT DOCUMENTS

| | | | |
|---|---|---|---|
| 3,940,637 | 2/1976 | Ohigashi et al. | 310/800 X |
| 4,234,813 | 11/1980 | Iguchi et al. | 310/800 X |
| 4,283,461 | 8/1981 | Wooden et al. | 310/800 X |
| 4,376,302 | 3/1983 | Miller | 310/800 X |
| 4,634,917 | 1/1987 | Dvorsky et al. | 310/800 X |
| 4,728,844 | 3/1988 | Wilson et al. | 310/800 X |

FOREIGN PATENT DOCUMENTS

| | | | |
|---|---|---|---|
| 3212618 | 10/1983 | Fed. Rep. of Germany | 310/800 |
| 3248222 | 6/1984 | Fed. Rep. of Germany | 310/800 |
| 8102223 | 8/1981 | World Int. Prop. O. | 310/800 |

Primary Examiner—Mark O. Budd
Attorney, Agent, or Firm—Kenneth E. Walden; Jacob Shuster

[57] ABSTRACT

A composite sheet transducer for producing voltage in response to stimuli and having a polymeric sheet sandwiched between a plurality of thin film conductive blocks arranged in non-conductively isolated block patterns of opposed electrode assemblies to establish a network of closed circuit segments of sensors. Electric shorting between opposed overlapping blocks is thereby limited to circuit segment areas of the composite sheet to avoid interference with voltage production in other areas of the composite sheet.

16 Claims, 2 Drawing Sheets

BLOCK PATTERNING OF THE METALLIZATION OF POLYVINYLIDENE FLUORIDE TRANSDUCERS

BACKGROUND OF THE INVENTION

This invention relates to a composite sheet comprising a sheet of polymerial material having at least one of piezoelectric and pyroelectric types of stimulated current producing properties sandwiched between blocks of conductive (usually metallic) material. The composite sheets, preferably manufactured in large sizes, are adapted to detect stimulation, and are particularly suited for covering large areas such as a wall or walls enclosing a room, such as a "safe room", for securing it against certain intrusion. The sheet act as a transducer to intercept mechanical or thermal stimulation and produce an electrical voltage.

By way of background, the properties of crystalline substances having either piezoelectric or pyroelectric characteristics are well known. Piezoelectric materials have a low efficiency in mechanical to electrical conversion in response to applied forces. Pyroelectric material has a heat to electrical conversion. It is known how to produce these material in sheet form to have the desired properties. Some sheets will exhibit both piezoelectric and pyroelectric characteristics.

Polyvinylidene fluoride (PVDF) is a polymer with excellent piezoelectric and pyroelectric properties. In sheet form, it may be manufactured into a transducer by coating opposite sides with a thin flexible metallic surfacing and polarizing. Wire leads are attached to each of the metallic surfaces from which an output voltage is obtained whenever the sheet form transducer is stimulated. The larger the sheet, the larger the capacitance between the two metallic surfaces. This higher capacitance, unfortunately, decreases the output of the transducer at high frequencies. The reason for this will be explained later in the specification. This characteristic presents a substantial problem which is minimized in the present invention. Also, if a sheet is damaged in such a way as to short-circuit the two large opposing metallic surfaces, the transducer will produce no electrical output, and is, therefore, rendered totally ineffective.

Such a condition for a large sheet of the size indicated herein for wallpapering a room, or other area, is not practically acceptable The shorting condition is also a substantial shortcoming for the arrangements disclosed in U.S. Pat. No. 4,283,461 wherein a puncture or tear of the coating or film would cause a short circuit which would render the device inoperative. Accordingly, the invention disclosed herein represents a substantial improvement to overcome shorting and improve frequency response. It limits the effect of electrical shorting to the immediate area of the film covered by the immediate overlying blocks and also limits the loss of frequency response as the sheet grows in size.

SUMMARY OF THE INVENTION

The present invention is summarized as a composite sheet of polyvinylidene fluoride, which is a polymer having excellent piezoelectric and pyroelectric properties, sandwiched between numerous capacitive electrode elements in the form of thin film electrically conducting blocks which are conductively separated one from another on the same side of the sheet. Each block overlies or overlaps portions of similar blocks located on the other side of the polymeric sheet means. There is thereby established between the overlapping blocks a network of sensors arranged in parallel and series throughout the composite sheet, whereby complete shorting between any overlying blocks leaves intact the remainder of the sensor network for defining paths for electrical charges produced by the polymeric sheet means in response to mechanical or thermal stimulation.

Since, in previous designs, large size sheets of polymeric material having piezoelectric and/or pyroelectric characteristics produce only low frequency output, and electrically shorted metallic surfaces rendered ineffective the entire sheet, the present invention, which overcomes these shortcomings, discloses a substantial improvement.

Accordingly, an object of the invention is to provide an improved composite sheet including a polymeric sheet having both piezoelectric and pyroelectric characteristics for producing a voltage in response to at least one of mechanical and thermal stimulation.

Another object of the invention is to provide a composite sheet, which, in large size, limits the loss in transducer output frequency range.

Still another object of the invention is to provide a composite sheet in large size which is adapted for covering a large area such as walls surrounding a safe room for producing voltage in response to entry type mechanical or thermal stimulation.

Yet another object of the invention is to provide a composite sheet including a sheet having piezoelectric and pyroelectric characteristics sandwiched between blocks of conductive metallic film for transducer output which is capable of remaining operative after localized electrical shorting.

These objects and features of the invention will be more fully understood from the detailed description to follow taken in conjunction with the drawing, the figures of which are now briefly described.

BRIEF DESCRIPTION OF THE DRAWINGS

FIG. 8 illustrates schematically the network of sensors in the form of capacitances established by the arrangement of FIG. 7 and 7a.

DETAILED DESCRIPTION OF THE INVENTION

Figure 1:
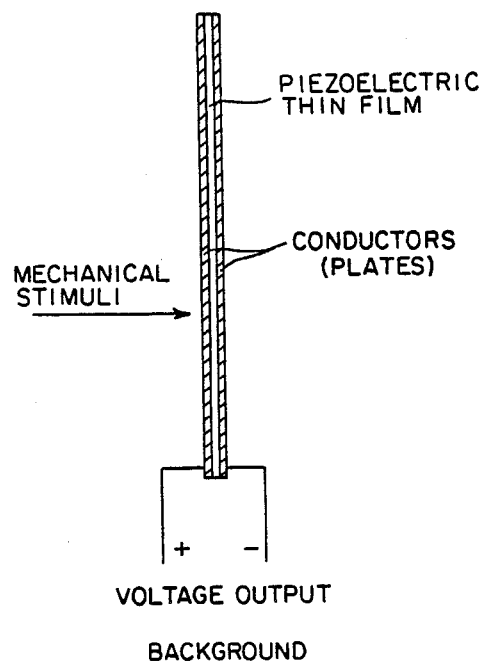
FIG. 1 is an illustration of electrical voltage produced by a polymeric film having piezoelectric characteristics acted on by mechanical stimuli.
Figure 2:
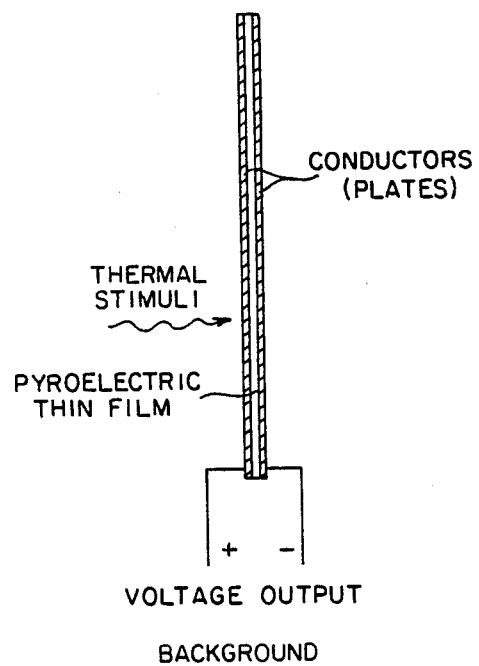
FIG. 2 an illustration of electrical voltage produced by a polymeric film having pyroelectric characteristics subjected to thermal stimuli.

By way of background, FIGS. 1 and 2 illustrate, respectively, piezoelectric and pyroelectric thin film materials sandwiched between conducting thin metallic plates which collect charges produced by the materials. The structure of the piezoelectric film in FIG. 1 is such that mechanical stimulation causes electrical charges to be produced on its opposite faces. These charges are collected from the metallic conductors and identified as voltage output. The structure of the pyroelectric film in FIG. 2 is such that, when thermally stimulated, electrical charges are produced on its opposite faces. These charges are likewise collected from the metallic conductors and identified as voltage output. There are several materials which exhibit these charge-producing characteristics that can be produced in thin film form. Some materials exhibit both piezoelectric and pyroelectric characteristics.

Polyvinylidene fluoride (PVDF) is a polymer with excellent piezoelectric and pyroelectric properties. Manufacturing and polarization practices are well known in the art and need not be discussed herein. Normally, the polymer is sandwiched between opposing conducting films running over substantially the entire face dimensions as illustrated in FIGS. 1 and 2. This arrangement has shortcomings, one of which is that physical damage even to a minute part of the composite thin film, which would electrically short circuit the outer conducting films, renders the entire sheet inoperative. This problem is recognized in U.S. Pat. No. 4,283,461, which employs a piezoelectric film as a marine antifouling coating, where it suggests that it is advantageous to subdivide into tracts the coating on a ships hull and connect each in parallel with its own potential so that a short circuit would not disrupt large areas. Another shortcoming of large sandwiched sheet sizes is that the larger the sheets the larger the capacitance between them. This higher capacitance decreases the output of the transducer (i.e., the film) at higher frequencies. This characteristic, referred to under Background, is now explained with reference to the diagrams shown in FIGS. 1-6 of the drawings. The metal coating on both sides of the material (FIGS. 1 and 2) are the plates of the capacitor and the material itself is the dielectric. As the size of the sensor is increased (larger sheet), the capacitance also increases. This increase in capacitance causes a loss of the high frequency content of a signal produced by the PVDF sensor.

Figure 3:
FIGS. 3–6 are electrical diagrams illustrating capacitance, impedance and frequency response.
Figure 4:
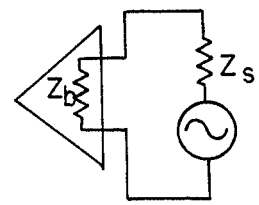
Figure 5:
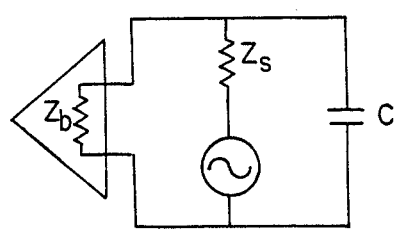
Figure 6:
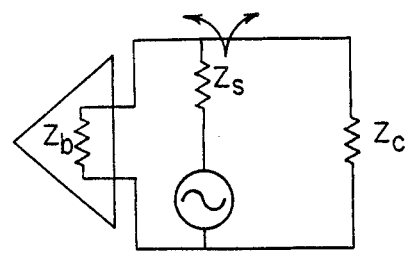

The reason for this is illustrated in the electrical diagrams (FIGS. 3-6). The excited area of the sheet (such as PVDF) is modeled by a signal source in series with a high impedance (Zs) (FIG. 3). In parallel with this source and impedance is the input impedance to a buffer amplifier (Zb) (FIG. 4) and the capacitance of the unexcited area of the PVDF sheet (FIG. 5). This capacitance can be modeled as an impedance that varies with frequency (Zc) in FIG. 6. Any signal leaving the source is divided between the buffer impedance and the capacitance impedance - whichever impedance is smaller gets more of the signal. Zc can be represented by the formula $$Zc = \frac{1}{2\pi f C}$$

where f = frequency and C = capacitance. To keep Zc the same as capacitance goes up (so the same amount of signal gets to the amplifier), the frequency must go down. Therefore, less of the higher frequencies get to the amplifier as the capacitance goes up.

The present invention provides an arrangement whereby the sandwiching means, comprising a plurality of plates arranged in inventive patterns, cures the short circuiting and limits the higher frequency problem. With this background in mind, description will now be directed to structure of the present invention.

Figure 7:
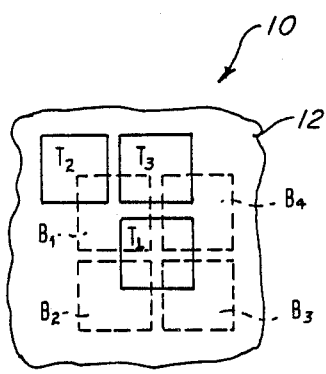
FIG. 7 is a face view of a section of composite sheet wherein a polymeric film is sandwiched between a pattern of conductive plates.
Figure 7A:
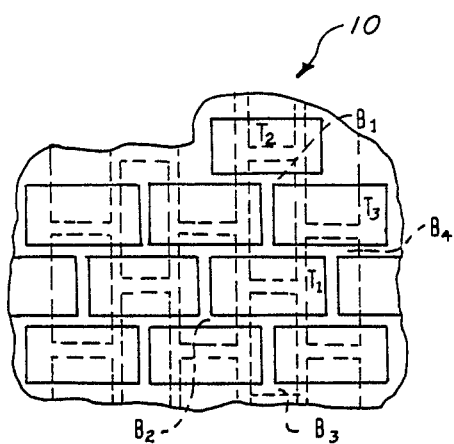
FIG. 7a is an alternate pattern arrangement similar to that of FIG. 7.

To limit the increase in capacitances for larger sensors and to provide greater reliability in case of physical damage, different metallization patterns have been developed. There is illustrated in FIGS. 7 and 7a face views of a metallization pattern consisting of a plurality, of small electrically conductive block covering closed surface areas in the form of squares or rectangles on opposite sides of the film. A section of composite sheet 10 formed of polymeric film 12, having at least one of piezoelectric and pyroelectric properies, is sandwiched between electrically conductive thin film blocks $T_1$, $T_2$, $T_3$, etc., on one side and $B_1$, $B_2$, $B_3$, $B_4$, etc., on the other side. All blocks on the same side. of film 12 are non-conductively separated one from another along their entire peripheries so as to prevent electrical conductivity therebetween. This gives effectively, many small and independent sensors.

Figure 8:
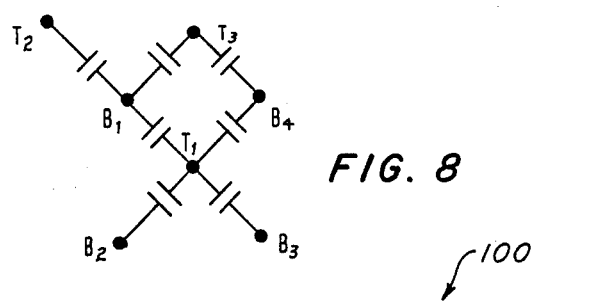

As can be seen in FIGS. 7 and 7a, each bock on the top of the film 12 overlies portions of four blocks on the back (a corner of four back blocks in FIG. 7), in effect establishing four sensor areas. Each block, for example, forms a sensor with each of the four different back blocks. Likewise, each back block forms a sensor with each of four different top blocks. Each top and back block therefore effectively acts as a connecting point for four different capacitive sensors forming cirlcuit segments interconnected in a series-parallel pattern. This pattern of circuit segments can be modeled by a network of connected capacitors as illustrated in FIG. 8. Note for example that there are four capacitances established between $T_1$ and $B_1$, and $B_4$ and $T_3$ and $B_1$, $B_4$ to form a closed circuit segment. Further capacitances between $T_1$, $B_g$, and $T_2$, $B_1$ are established on and on throughout the composite sheet as shown in FIG. 8 in a continuing network.

Figure 9:
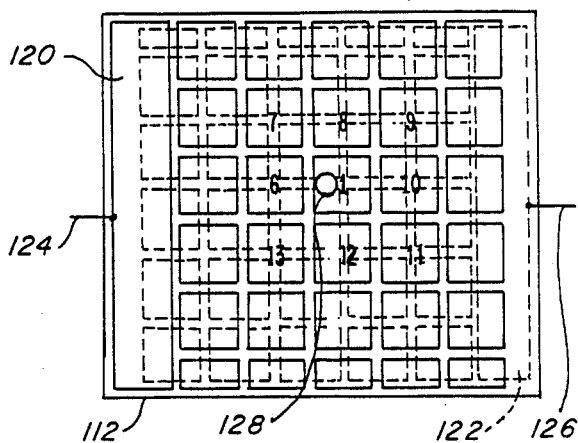
FIG. 9 is another face view of a more complete composite sheet illustrating the invention.

FIG. 9 illustrates a composite sheet 100 formed of a polymeric sheet 112 (such as PVDF) sandwiched between numerous conductive thin film blocks, some of which on the top are numbered 1, 6, 7, 8, 9, 10, 11, 12, and 13, while others on the back are numbered 2, 3, 4, and 5. Strips 120 and 122 of conductive film similar to that of the blocks are provided on the top and back, respectively, of sheet 112 to define electrodes or collectors for voltage produced on opposite faces of sheet 112. The blocks are preferably of a thin conductive coating (film) arranged in patterns. They may be square or rectangular, as illustrated, or any other configuration. Their number may vary considerably, depending upon size and sheet area.

Figure 10:
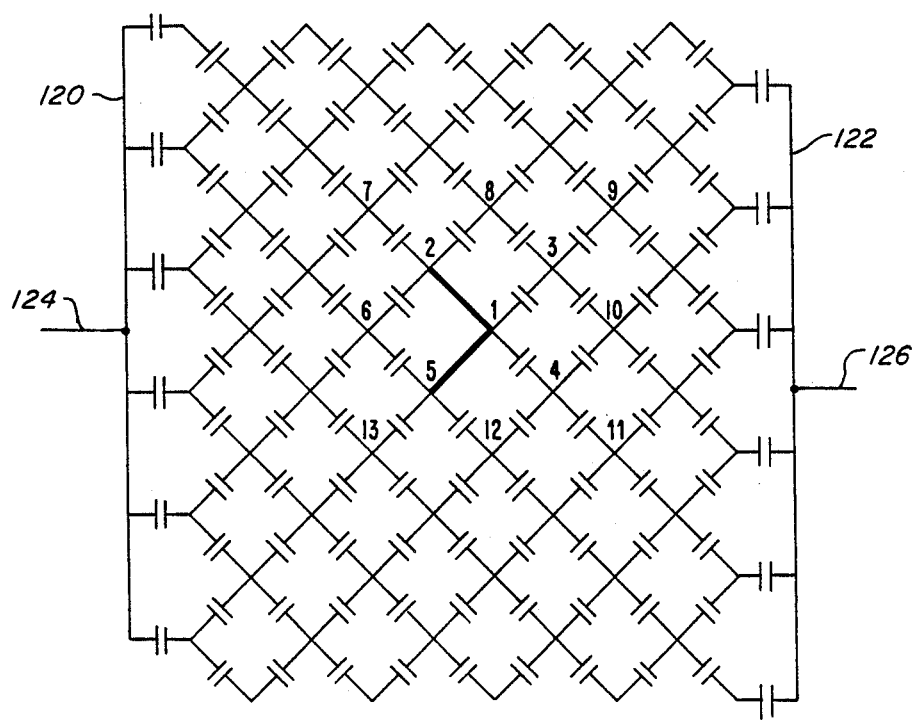
FIG. 10 is a schematic illustration (similar to but more complete than that of FIG. 8) of the network of sensors in the form of capacitances established throughout composite sheet illustrated in FIG. 9.

FIG. 10 is a schematic illustration of the entire network of sensors arranged as capacitances throughout composite sheet 100 in FIG. 9. Opposed blocks, as illustrated in FIG. 9, act as numerous sensors, all of which add and substract to a composite signal (voltage) which is collected by leads 124 and 126, respectively, from strips or output electrodes 120 and 122 preferably located on opposite sides of film 112. The series -parallel network of sensors reduces loss of high frequency content of signal produced by the sheet.

When any sensor of a network circuit segment is stimulated (mechanically or thermally), the signal it produces passes through the capacitors and out to the edges of the sheet to strips 120 and 122. A major advantage of this design is in the many paths a signal can follow. I parts of composite sheet 100 are damaged or even removed, such damage is limited to isolated circuit segments leaving many paths through other circuit segments for the signal to follow to reach the edges of the sheet.

The pattern of FIG. 9 also illustrates resilience to damage by penetration. If a sensor should be pierced in a manner illustrated by hole 128, to connect (short-circuit) a top and back corner together the two sensors of that small area would cease working as shown in FIG. 10. The remaining undamaged pattern would, however, still pass all signals produced by adjoining sensors (corners), leaving PVDF sheet 112 essentially fully functional.

The numerous conductive blocks and electrodes or collector strips 120 and 122 may be metallized deposits on opposite faces (top and back) of the voltage producing PVDF film.

The sensors presented by the composite sheet are sensitive to mechanical stimulation such as drilling, filing, and impacting, and they show fairly unique signatures associated with such stimulation or excitation. The sensors are also sensitive to thermal stimulation. Amplifiers and necessary electronics are known in the art for processing signals produced on the film by either form of stimulation.

Composite sheets as described herein may be produced in large sizes, thus allowing their application as "wallpaper" to a surface such as a wall facing a room or other area to be secured against intrusion exhibiting mechanical or thermal stimulation.

While description and illustration has been made to conventional square and rectangular conductive thin film in block patterns, other shapes and pattern arrangements may also be used. It is important that the block shapes and pattern allow for one area of each block to overly areas of a plurality of opposing blocks to form the circuit segments afore-mentioned. The blocks, which must be conductively separated, may be deposited on the polymeric film by means known in the art such as metallization, sputtering, and printing. Experimentation has shown that the most consistent output signal from stimulation of a large sheet containing numerous sensors occurs when the blocks along one edge of a surface are connected together in a strip, while on the other surface the blocks are connected together along the edge furthermost from the first strip. The blocks may actually be connected together, however, as illustrated in FIG. 9, electrode strips 120 and 122 may be connected directly to polymeric film 112, on opposite sides, preferably at spaced apart locations. Voltage of different potential collect on spaced apart locations on the surfaces of film 112, even on the same side. But, collection is preferably made from opposite sides of film 112 at locations that are linearly separated. Sheets manufactured with voltage collection to be made at the edges facilitates wallpapering of large areas.

There has been disclosed an improved composite sheet adapted for converting mechanical and thermal stimulation into a voltage output differential. Sheets according to the invention may be manufactured and used in large sizes with only minimal high frequency degradation for the reasons disclosed herein. Furthermore, the block arrangement is such that damage, including shorting, to the sheet will not incapacitate the whole sheet.

The composite sheet acts as a transducer. It converts mechanical and thermal stimulation into electrical energy. Thus, it finds particular use in security applications for detecting physical and thermal intrusion, but is not so limited. The invention has been described generally with certain specifics. It will be expected, however, that changes or variation may be made to the construction thereof without departing from the spirit of the invention, which is defined by the scope of the claims herein.

EXAMPLE OF SHEET DIMENSIONS AND APPLICATION

A composite sheet constructed according to the invention may be made in various sizes sufficient to cover the inside of walls enclosing a room. Preferably, the composite sheet sizes approximate those of wallpaper available in commercial markets. One side of the sheet may be provided with an adhesive, preferably of a type which will permit the sheet to be removed from a wall.

The PVDF sheet may range in thickness from about 5 to 750 microns. However, the preferred thickness is usually 9–30 microns. The blocks range in sizes from around $\frac{1}{4}$ to 1" across. They may square or rectangular, as illustrated, or of any other configuration which allows overlap, whereby one overies a portion of a plurality of opposed blocks. The blocks must be conductive. They may be adhered or otherwise secured to the PVDF sheet. The material defining the blocks may be deposited directly as a film on opposite sides of the PVDF sheet. Block thicknesses range from 150 to 1000 angstroms. The blocks are separated from one another on the same side of the PVDF sheet just sufficient to prevent conductivity from one to another.

What is claimed is:

1. In a transducer for producing electrical charges in response to stimulation thereof, including a polymeric sheet having opposite sides and a pair of electrode assemblies between which the polymeric sheet is sandwiched, the improvement residing in each of said electrode assemblies including a plurality of conductively separated film blocks on areas of each of the opposite sides of the polymeric sheet, each of the film blocks on one of the opposite sides overlapping a plurality of the film blocks on the other of the opposite sides of the polymeric sheet.

2. The improvement as defined in claim 1 wherein the overlapping film blocks on the opposite sides of the polymeric sheet form circuit segments of capacitive sensors interconnected in a series-parallel network.

3. The improvement as defined in claim 2 wherein each of the circuit segments is established by one of the film blocks on said one of the opposite sides overlapping four of the film blocks on the other of the opposite sides of the polymeric sheet.

4. The invention according to claim 2 wherein the polymeric sheet is polyvinylidene fluoride.

5. The invention according to claim 1 the conductive film blocks are metal.

6. The invention according to claim 5 further defined by the polymeric sheet being polyvinylidene fluoride.

7. The invention according to claim 5 further defined by the film blocks being thin conductive coatings arranged in rectangular patterns.

8. The invention according to claim 1 wherein the electrode assemblies further include electrodes located at spaced apart locations on the polymeric sheet.

9. The invention according to claim 8 wherein the spaced apart locations are on the opposite sides of the polymeric sheet means.

10. The invention according to claim 9 wherein the electrodes are connected to a plurality of the conductive film blocks.

11. A transducer in the form of a opposite sheet for receiving stimulation and producing electrical charges in response thereto, comprising: a sheet formed of polymeric material; a plurality of conductive thin film blocks arranged in patterns on opposite sides of the sheet sandwiched therebetween; each of said blocks on one of the opposite sides of the sheet being laterally offset from and overlapping a plurality of the blocks on the other of the opposite sides to define a network of sensors formed at spaced surface areas producing said electrical charges in response to said stimulation; and electrode means connected to said network for collecting the electrical charges at spaced-apart locations on the sheet.

12. The invention according to claim 11 wherein the polymeric material of the sheet is polyvinylidene fluoride.

13. The invention according to claim 12 wherein the electrode means comprises electrodes connected to the opposite sides of the sheet.

14. The invention according to claim 13 wherein the electrodes are connected to a plurality of the conductive thin films on the sheet.

15. In a transducer having a non-conductive sheet with opposite sides and electrode means for producing electrical charges in response to stimulation applied therethrough to the sheet, said electrode means including spaced electrodes between which said charges are collected, conductive film means cooperating with the sheet for establishing a plurality of capacitive sensors interconnected in a network between the electrodes; the film means being positioned in operative relation on the opposite sides of the sheet for limiting shorting of the network, in response to locationally restricted damage to the transducer, to the capacitive sensors at which said damage occurs.

16. The transducer as defined in claim 15 wherein said conductive film means comprises a plurality of electrode elements respectively coating conductively areas on the opposite sides of the sheet spaced from each other, each of the separated areas on one of the opposite sides overlapping a plurality of the separated areas on the other of the opposite sides of the sheet.

* * * * *